(12) United States Patent
Tian et al.

(10) Patent No.: US 8,967,080 B2
(45) Date of Patent: Mar. 3, 2015

(54) TOP PLATE OF MICROWAVE PLASMA PROCESSING APPARATUS, PLASMA PROCESSING APPARATUS AND PLASMA PROCESSING METHOD

(75) Inventors: Caizhong Tian, Hyogo (JP); Kiyotaka Ishibashi, Hyogo (JP); Toshihisa Nozawa, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 375 days.

(21) Appl. No.: 12/867,343

(22) PCT Filed: Feb. 10, 2009

(86) PCT No.: PCT/JP2009/052200
§ 371 (c)(1),
(2), (4) Date: Sep. 13, 2010

(87) PCT Pub. No.: WO2009/101927
PCT Pub. Date: Aug. 20, 2009

(65) Prior Publication Data
US 2011/0000780 A1    Jan. 6, 2011

(30) Foreign Application Priority Data
Feb. 13, 2008   (JP) .................................. 2008-031310

(51) Int. Cl.
*C23C 16/00*   (2006.01)
*C23F 1/00*   (2006.01)
(Continued)

(52) U.S. Cl.
CPC ............. *H05H 1/46* (2013.01); *H01J 37/32192* (2013.01); *H01J 37/32211* (2013.01); *H01J 37/3222* (2013.01); *H01J 37/32238* (2013.01)
USPC ........ 118/723 MW; 156/345.41; 156/345.35; 156/345.36; 118/723 ME

(58) Field of Classification Search
CPC ..................... H01J 37/32238; H01J 37/32192; H01J 37/32247; H01J 37/32284
USPC .............. 118/723 MW, 723 ME; 156/345.36, 156/345.41
See application file for complete search history.

(56) References Cited

U.S. PATENT DOCUMENTS

2004/0149741 A1* 8/2004 Ishii et al. .................... 219/678
2005/0011455 A1   1/2005 Yamamoto et al.
(Continued)

FOREIGN PATENT DOCUMENTS

CN   100492591 C   5/2009
JP   07-034253 A   2/1995
(Continued)

OTHER PUBLICATIONS

English Machine Translation JP9232099, Tauchi et al dated Sep. 5, 1997.*

(Continued)

*Primary Examiner* — Rakesh Dhingra
(74) *Attorney, Agent, or Firm* — Pearne & Gordon LLP

(57) ABSTRACT

A plasma generation chamber of a plasma processing apparatus is closed by a top plate 3. The top plate 3 has recesses 3A on its surface facing the plasma generation chamber and a central recess 3B on an opposite surface. The top plate 3 is coupled to an antenna thereon. If a microwave is supplied to the antenna, the microwave is radiated through slots of the antenna. The microwave is propagated through the top plate 3 such that the microwave has a plane of polarization and the microwave forms a circularly polarized wave as a whole. Here, resonance absorption of the microwave occurs at a side surface of recesses 3A and the microwave is propagated within the recesses 3A in a single mode. Strong plasma can be generated within each of the recesses 3A, so that a stable plasma mode can be generated in the top plate 3.

8 Claims, 6 Drawing Sheets

(51) Int. Cl.
   *H01L 21/306* (2006.01)
   *H05H 1/46* (2006.01)
   *H01J 37/32* (2006.01)

(56) References Cited

U.S. PATENT DOCUMENTS

| | | | |
|---|---|---|---|
| 2005/0017291 A1 | 1/2005 | Hirler | |
| 2005/0172901 A1* | 8/2005 | Ishibashi et al. | 118/723 I |
| 2007/0113788 A1* | 5/2007 | Nozawa et al. | 118/723 MW |
| 2009/0152243 A1* | 6/2009 | Horiguchi et al. | 216/69 |

FOREIGN PATENT DOCUMENTS

| | | | | |
|---|---|---|---|---|
| JP | 07-232099 A | | 9/1995 | |
| JP | 9-232099 | * | 9/1997 | H05H 1/46 |
| JP | 2000-273646 | * | 10/2000 | C23C 16/511 |
| JP | 2003-151797 A | | 5/2003 | |
| JP | 2004-200307 A | | 7/2004 | |
| JP | 2005-100931 A | | 4/2005 | |
| JP | 2007-103519 | * | 4/2007 | H01L 21/205 |
| JP | 2007-103519 A | | 4/2007 | |
| JP | 2007-188722 A | | 7/2007 | |
| TW | 200522801 A | | 7/2005 | |
| WO | 2007/040110 A1 | | 4/2007 | |

OTHER PUBLICATIONS

English Machine Translation JP2000273646, Mitsuhira et al, dated Oct. 3, 2000.*
Korean Office action for 10-2010-7018236 dated Oct. 18, 2011.
International Search Report for PCT/JP2009/052200 dated Apr. 28, 2009.

* cited by examiner

TOP PLATE OF MICROWAVE PLASMA PROCESSING APPARATUS, PLASMA PROCESSING APPARATUS AND PLASMA PROCESSING METHOD

TECHNICAL FIELD

The present invention relates to a top plate of a microwave plasma processing apparatus, a plasma processing apparatus, and a plasma processing method.

BACKGROUND ART

A plasma processing technology has been widely used for many semiconductor devices such as an integrated circuit, a liquid crystal display and a solar cell. Although the plasma processing technology has been used for thin film deposition process or an etching process in a semiconductor manufacturing process, a highly advanced plasma process is required for a product having a higher performance and multi function (for example, an ultra fine process technology). In particular, a microwave plasma processing apparatus capable of generating plasma of low pressure and high density has drawn attention.

A plasma processing apparatus using a RLSA (Radial Line Slot Antenna) plasma microwave source ionizes a gas by microwave discharge and generates plasma. A microwave is supplied through slots of the antenna via a waveguide, propagated through a top plate, and radiated into a plasma generation chamber.

If the top plate is simple and flat, the microwave is not uniformly propagated in a central portion and a peripheral portion of the top plate, and, thus, plasma cannot be uniformly generated. On the other hand, if the top plate has different thicknesses in different portions or has a protruded portion therein, a resonance area of the microwave is formed depending on a plasma condition, and, thus, propagation in a diametric direction can be controlled.

The microwave within the top plate is propagated simultaneously in a diametric direction and in a circumferential direction (a rotation direction). So far, a subject of microwave propagation control has been mainly focused on propagation in a diametric direction as disclosed in Patent Document 1. As a result, there has been a problem in that plasma is non-uniformly distributed due to non-uniformity of propagation in a circumferential direction. In particular, such a phenomenon becomes serious at a low microwave power. Further, in order to control propagation in a diametric direction and propagation in a circumferential direction at the same time, a shape of the top plate becomes complicated, which causes an increase in manufacturing costs.

Patent Document 1: Japanese Patent Laid-open Publication No. 2005-100931

DISCLOSURE OF THE INVENTION

Problems to be Solved by the Invention

In the above-described conventional technology, there has been a problem in that plasma is non-uniformly distributed due to non-uniformity of microwave propagation in a circumferential direction. If conditions in a chamber such as a gas and a temperature are changed according to a plasma process, a plasma mode is also changed depending on a microwave frequency and a gas pressure. Thus, it is necessary to change a top plate and a wavelength of a microwave propagated within the top plate.

In view of the foregoing circumstances, the present invention has been conceived and the present invention provides a top plate of a microwave plasma processing apparatus, a plasma processing apparatus, and a plasma processing method capable of generating plasma with high reproducibility in a stable mode.

Means for Solving the Problems

In accordance with a first aspect of the present invention, there is provided a top plate made of a dielectric material for propagating a microwave in a microwave plasma processing apparatus. The top plate includes at least one recess formed in a surface of the top plate on a plasma generation side. Here, resonance absorption of the microwave occurs at a side surface of the recess, and the microwave is propagated within the recess in a single mode.

Desirably, the top plate may have a thickness that allows the microwave to be propagated in a multi-mode.

Desirably, the at least one recess may be plural in number.

Further, the at least one recess may be arranged on one or more circles of which a center is positioned at an inlet position of the microwave.

Furthermore, a radius of a circle on which the at least one recess is arranged may be an approximately integer multiple of a wavelength of the microwave propagated within the dielectric material.

Desirably, the at least one recess may be arranged to have a point symmetry with respect to an inlet position of the microwave.

Desirably, a diameter of the at least one recess in a propagation direction of the microwave may be in a range from about ⅓ to about ½ of a wavelength of the microwave propagated within the dielectric material.

Desirably, a depth of the at least one recess may be in a range from about ¼ to about ⅜ of a wavelength of the microwave propagated within the dielectric material.

Desirably, a cross section of the at least one recess parallel to the surface on the plasma generation side may have a circular shape.

In accordance with a second aspect of the present invention, there is provided a plasma processing apparatus including a plasma generation chamber that performs a plasma process; a slot antenna that introduces a microwave for plasma generation into the plasma generation chamber; and a top plate formed in a surface on a plasma generation side. Here, resonance absorption of the microwave may occur at a side surface of the recess, and the microwave may be propagated within the recess in a single mode.

In accordance with a third aspect of the present invention, there is provided a plasma processing method including generating plasma by using a top plate including a recess formed in a surface of the top plate on a plasma generation side. Here, resonance absorption of a microwave may occur at a side surface of the recess, and the microwave may be propagated within the recess in a single mode.

Moreover, generating plasma may further include generating plasma under two or more different atmosphere conditions in a plasma generation chamber without changing the top plate and a wavelength of the microwave propagated within the top plate.

Effect of the Invention

In accordance with a top plate of a microwave plasma processing apparatus, a plasma processing apparatus, and a plasma processing method, the top plate has a recess therein, and, thus, resonance absorption of a microwave occurs at a side surface of the recess and the microwave is propagated within the recess in a single mode, so that uniform and stable plasma can be generated.

Further, even if an atmosphere in a plasma generation chamber is changed, plasma can be generated and a plasma mode can be stabilized without changing the top plate and a wavelength of the microwave propagated through the inside of the top plate.

EXPLANATION OF CODES

1: Plasma processing apparatus
2: Plasma generation chamber (Chamber)
3: Top plate (Dielectric member)
3A: Recess
3B: Central recess
4: Antenna
4A: Waveguide member (Shield member)
4B: Radial line slot antenna (RLSA)
4C: Wavelength shortening plate (Dielectric member)
5: Waveguide
6: Substrate holding table
7: Gas passage, Gas inlet port
8: Plasma
10: Substrate

BEST MODE FOR CARRYING OUT THE INVENTION

Embodiment

Figure 1:
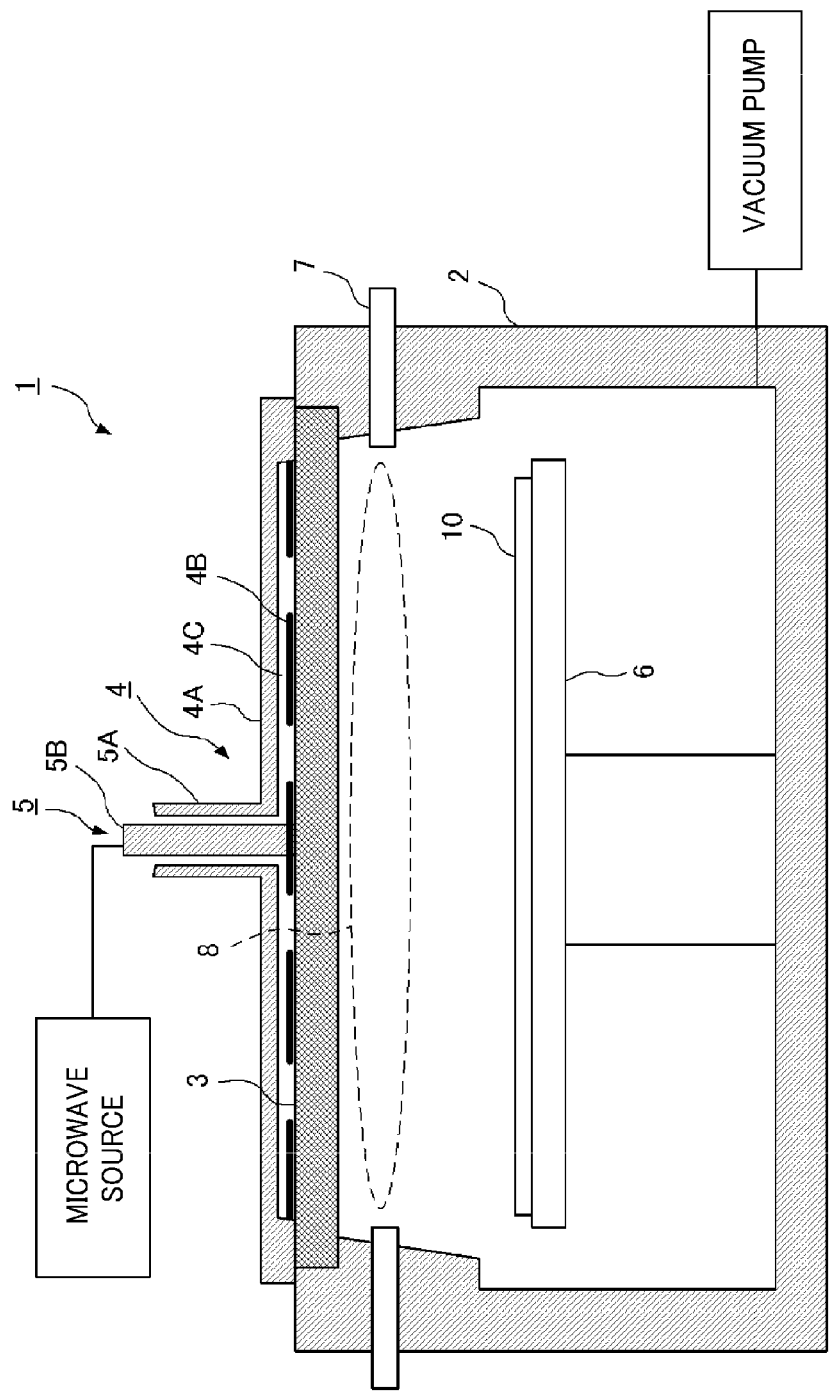
FIG. 1 is a cross-sectional view of a plasma processing apparatus in accordance with an embodiment.

Hereinafter, a top plate of a microwave plasma processing apparatus in accordance with a first aspect of the present invention will be explained in detail with reference to the accompanying drawings. Further, same or like parts in the drawings will be assigned same reference numerals and explanation thereof will be omitted. FIG. 1 is a cross-sectional view of a plasma processing apparatus in accordance with an embodiment of the present invention. A plasma processing apparatus 1 includes a plasma generation chamber 2, a top plate (a dielectric member) 3, an antenna 4, a waveguide 5, a substrate holding table 6, and a gas passage 7. The antenna 4 includes a waveguide member (a shield member) 4A, a radial line slot antenna (RLSA) 4B, and a wavelength shortening plate (a dielectric member) 4C. The waveguide 5 is a coaxial waveguide including an outer waveguide 5A and an inner waveguide 5B.

The plasma generation chamber 2 of the plasma processing apparatus 1 is closed by the top plate 3. Here, the inside of the plasma generation chamber 2 is kept in a vacuum state by a vacuum pump. The top plate 3 is coupled to the antenna 4 thereon. The antenna 4 is connected with the waveguide 5. The waveguide member 4A is connected with the outer waveguide 5A and the radial line slot antenna 4B is coupled to the inner waveguide 5B. The wavelength shortening plate 4C is positioned between the waveguide member 4A and the radial line slot antenna 4B to shorten a wavelength of a microwave. The wavelength shortening plate 4C is made of a dielectric material such as $SiO_2$ or $Al_2O_3$.

A microwave is supplied from a microwave source via the waveguide 5. The microwave is propagated between the waveguide member 4A and the radial line slot antenna 4B in a diametric direction and is radiated through slots of the radial line slot antenna 4B. The microwave is propagated through the top plate 3 such that the microwave has a plane of polarization and the microwave forms a circularly polarized wave as a whole.

There will be explained the top plate 3 in accordance with the embodiment of the present invention. The top plate has a simple and flat shape or has various thicknesses suitable for resonance conditions of plasma, thereby controlling propagation in a diametric direction.

Figure 2:
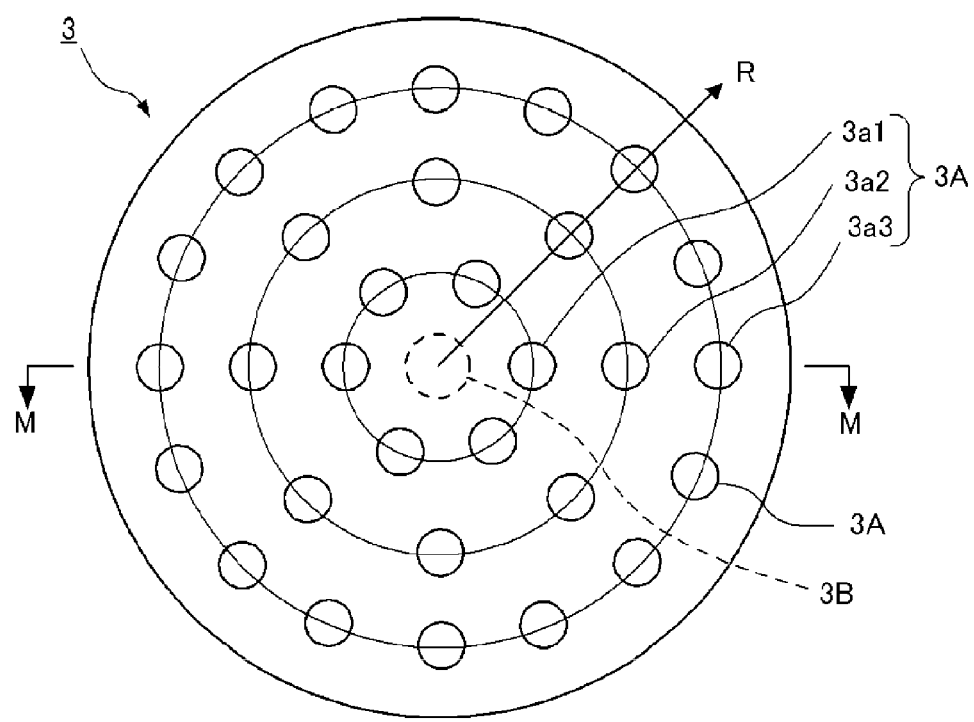
FIG. 2 is a plane view of a top plate of a microwave plasma processing apparatus when viewed from a plasma generation chamber in accordance with an embodiment.

FIG. 2 is a plane view, when viewed from the plasma generation chamber, of the top plate 3 of the microwave plasma processing apparatus in accordance with the embodiment of the present invention. The top plate 3 illustrated in FIG. 2 is made of a dielectric material propagating a microwave, for example, quartz and alumina. The top plate 3 may has a thickness that allows a microwave to be propagated in a multi-mode, and for example, in case of quartz, the thickness may be about 30 mm. The top plate 3 has recesses 3A on its surface facing the chamber 2 and a central recess 3B on an opposite surface. The central recess 3B has the same center axis as the antenna 4 and the waveguide 5 for supplying the microwave into the chamber 2. Plasma with good axial symmetry around the central recess 3B can be generated in the chamber 2 by adjusting a position of the central recess 3B to an inlet position of the microwave. An arrow R of FIG. 2 indicates an example of a diametric direction from a center of the central recess 3B and this direction is the same as a propagation direction of the microwave travelling within the top plate 3. The recesses 3A formed in the same diametric direction are denoted by $3a1$, $3a2$, $3a3$ in sequence from the center.

Figure 3A:
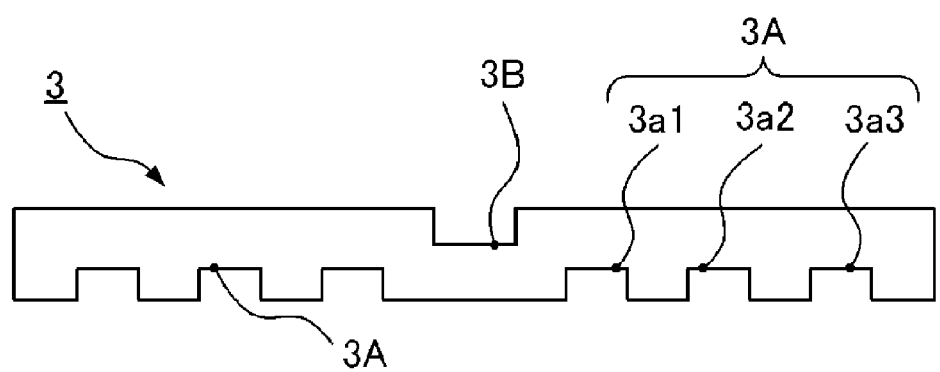
FIG. 3A is a cross-sectional view taken along a line M-M of FIG. 2.
Figure 3B:
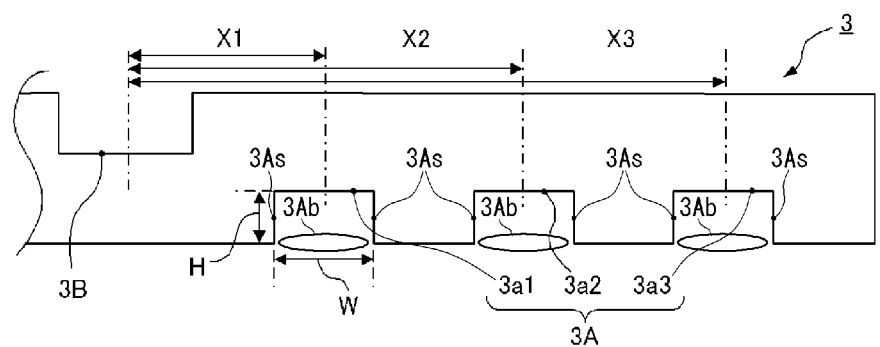
FIG. 3B is a partially enlarged view of FIG. 3A.

FIG. 3A is a cross-sectional view taken along a line M-M of FIG. 2. FIG. 3B is a partially enlarged view of FIG. 3A. Lengths of the recesses 3A in the diametric direction are denoted by W and depths thereof are denoted by H. A dashed dotted line drawn perpendicularly to each of the central recess 3B and the recesses 3A indicates a center position of each recess. From the center of the central recess 3B, a distance to the center of the recess $3a1$ is denoted by X1, a distance to the center of the recess 3a2 is denoted by X2, and a distance to the center of the recess 3a3 is denoted by X3, respectively.

Figure 4:
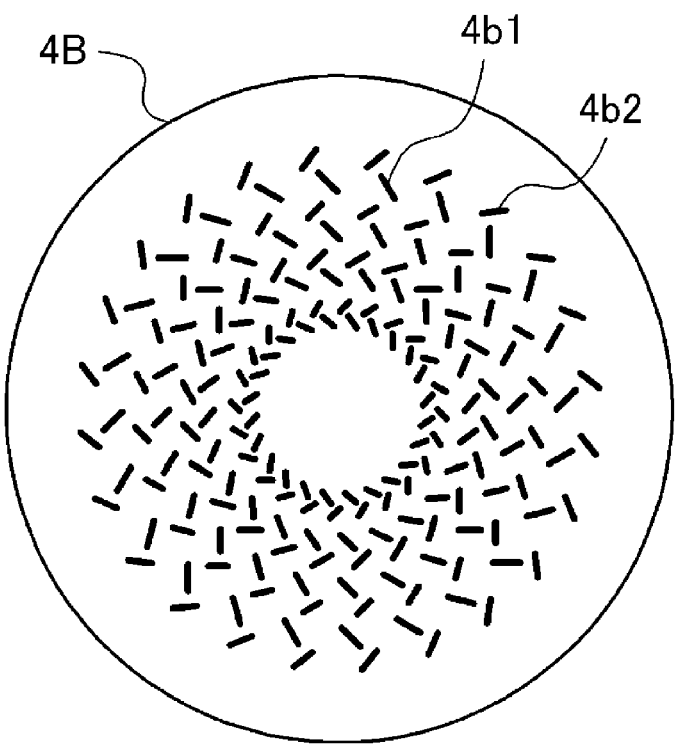
FIG. 4 is a plane view of a radial line slot antenna.

FIG. 4 is a plane view showing an example of the radial line slot antenna 4B. The radial line slot antenna 4B is configured to cover an opening of the waveguide member 4A of the antenna 4 and has a plurality of slots 4b1 and 4b2. Plasma can be spread by positioning the radial line slot antenna 4B at one end of the waveguide member 4A. As depicted in FIG. 4, the slots 4b1 and 4b2 are concentrically arranged and are orthogonal to each other. Since the plasma is propagated perpendicularly to longitudinal directions of the slots 4b1 and 4b2, the plasma is generated right below the top plate 3.

A microwave is radiated through the slots 4b1 and 4b2 in a downward direction and propagated in a diametric direction, and they are repeatedly reflected within the top plate 3 and interfered with each other to thereby become strong. As a result, a standing wave is generated. At this time, resonance absorption as high efficiency energy absorption of the microwave occurs at side surfaces 3As of the recesses 3A formed in the top plate 3 and the microwave is propagated within the recesses 3A in a single mode. The microwaves are propagated within each of the multiple recesses 3A in a single mode, and, thus, stably distributed plasma is generated right below the top plate 3. In other portions of the top plate 3 than the recesses 3A, surface absorption of the microwave occurs, and, thus, surface wave plasma is generated. Since the surface wave plasma has a low plasma density, it has little influence on the entire top plate 3. Therefore, a dense area/coarse area pattern of the plasma becomes uniform in the top plate 3, and, thus, a plasma mode becomes stable.

When the microwave is supplied into the chamber 2 and the plasma is radiated, an inactive gas such as argon (Ar), xenon (Xe) or nitrogen ($N_2$) is introduced through the gas passage 7, if necessary, together with a processing gas such as hydrogen, so that argon (Ar) or xenon (Xe) plasma 8 is generated. Here, even if the inside of the chamber 2 is maintained in a high vacuum state having a relatively low pressure in the range from about 10 mPa to about several 10 Pa, plasma can be generated stably.

In order for the microwave to be propagated within the recesses 3A in a single mode, it is desirable to set a diameters W of the recesses 3A in the propagation direction may be set to be in the range from about ⅓ to about ½ of a wavelength of a microwave propagated within the dielectric material. If the diameters W of the recesses 3A in the propagation direction are greater than about ½ of the wavelength, an eigen mode is generated within the recesses 3A and plasma may be generated in various modes depending on conditions in the plasma generation chamber. Besides, since an antiphase occurs, a power of the microwave becomes weak and strong plasma cannot be obtained. If the diameters W of the recesses 3A in the propagation direction are not greater than about ⅓ of the wavelength, the plasma mode is maintained as stable but a plasma generation area becomes decreased. Since the plasma generation area is proportional to the diameters W, in order to obtain the same amount of plasma, it is necessary to provide many recesses 3A. However, in consideration of forming recesses 3A in the top plate 3, the number of the recesses 3A needs be small. Accordingly, it is desirable to set the diameters W to be greater than about ⅓ of the wavelength and to be nearly about ½ of the wavelength if possible.

Further, in order for the microwave to be propagated within the recesses 3A in a single mode, it is desirable to set depths H of the recesses 3A in the range from about ¼ to about ⅜ of the wavelength of the microwave propagated within the dielectric member. If the depths H of the recesses 3A are not greater than about ¼ of the wavelength, plasma is generated in the vicinity 3Ab of openings of the recesses 3A, and, thus, an eigen mode may be generated, or surface wave plasma is generated irregularly, and, thus, a dense area/coarse area pattern of the plasma is not fixed and a plasma mode becomes unstable. Furthermore, if the depths H of the recesses 3A are greater than about ⅜ of the wavelength, plasma is generated at an inner side of the recesses 3A, and, thus, efficiency of the plasma process is decreased.

When a multiple number of recesses 3A each satisfying the above-described diameters W and depths H are formed in a surface of the top plate 3 on a plasma generation side, the recesses 3A may be arranged on a circle of which a center is positioned at the inlet position of the microwave. In this case, the number of circle is 1 or more. Further, desirably, a diameter of the circle on which the recesses 3A are arranged may be set such that the recesses 3A are disposed at positions where standing waves become strong each other. Furthermore, the top plate 3 can be installed regardless of a circumferential direction of the top plate 3 by arranging the recesses 3A to have a point symmetry.

By way of example, in FIG. 3B, X1 represents a size of one time of the wavelength of the microwave propagated within the dielectric member, X2 represents a size of two times of the wavelength, and X3 represents a size of three times of the wavelength. At each position of an integer multiple of the wavelength from the center of the central recess 3B, the generated standing waves become strong and power of the microwave becomes greatest. If resonance absorption of the microwave occurs at the side surface of the recesses 3A, energy can be obtained efficiently. Since the recesses 3a1, 3a2, and 3a3 are formed at these positions, resonance absorption of the microwave occurs at a side surface of each recess and the microwave is propagated in a single mode, so that a stable plasma distribution can be obtained efficiently.

A radius of the circle may be an approximately integer multiple of the wavelength of the microwave propagated within the dielectric member in consideration of the diameters W of the recesses 3A. Desirably, the radius of the circle may be in the range of ±¼ of the wavelength from the integer multiple of the wavelength.

Although FIG. 3B illustrates that the recesses 3A are formed at every position of an integer multiple of the wavelength in the same diametric direction, the recesses 3A may be formed at any one of positions X1, X2, and X3 in the same diametric direction and may be formed at the positions of X1 and X2 or X2 and X3. Desirably, the recesses 3A may be arranged at positions on circles including X1, X2 and X3 of which each center is positioned at the central recess 3B so as to have a point symmetry. The number of the circles may be varied depending on a relationship between a diameter of the top plate 3 and the wavelength of the microwave propagated within the dielectric member and a range of the radius of the circle is not limited to a size of three times of the wavelength.

The central recess 3B is formed to fix the inlet position of the microwave or a position of the top plate 3 and is not necessarily formed. Further, a position of the central recess 3B may not coincide with the inlet position of the microwave or the position of the central recess 3B may not coincide with the center position of the top plate 3. In this case, positions of the recesses 3A are determined based on the inlet position of the microwave.

Figure 5A:
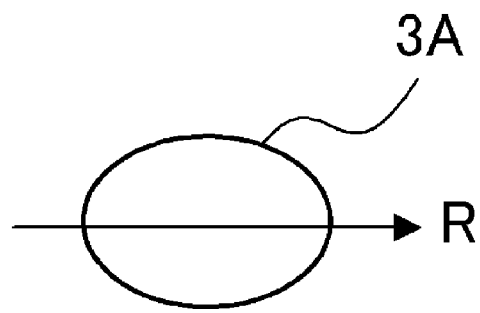
FIG. 5A is a plane view showing a modified recess in accordance with another embodiment.
Figure 5B:
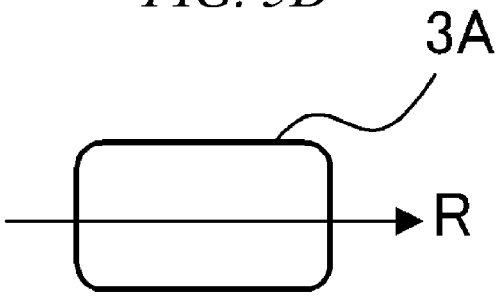
FIG. 5B is a plane view showing a modified recess in accordance with another embodiment.
Figure 6A:
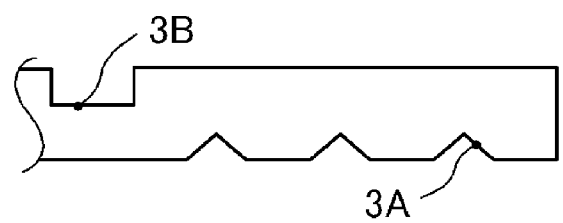
FIG. 6A is a longitudinal cross-sectional view showing a modified recess in accordance with still another embodiment.
Figure 6B:
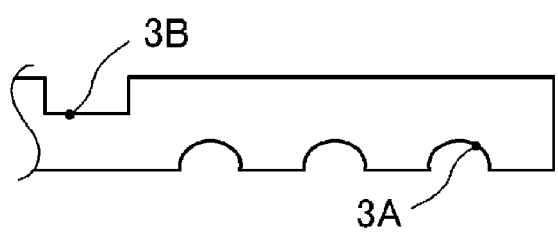
FIG. 6B is a longitudinal cross-sectional view showing a modified recess in accordance with still another embodiment.

FIGS. 5A and 5B are plane views showing modified recesses in accordance with another embodiment and show a surface parallel to a surface of a top plate on a plasma generation side. FIGS. 6A and 6B are longitudinal cross-sectional views showing modified recesses in accordance with still another embodiment and show a surface perpendicular to a surface of a top plate on a plasma generation side.

In the embodiment of the present invention, a cross section of the recesses 3A parallel to the surface of the top plate 3 on the plasma generation side has been illustrated as a circular shape, but it may have an elliptic shape or a quadrangular shape with rounded corners as shown in FIGS. 5A and 5B. These shapes are just examples of modified recesses and the cross section may have any other shapes. Although the circular shape is desirable in consideration of the convenience of processing the top plate, any shape is possible as long as the diameters W of the recesses 3A satisfies the range from about ⅓ to about ½ of the wavelength of the microwave propagated within the dielectric member, and the recesses 3A have a line symmetry with respect to the diametric direction.

Further, in the embodiment of the present invention, shapes of the recesses 3A of the top plate 3 have been illustrated as a cylindrical shape in FIGS. 2 and 3, but it may have a hemispherical shape or a cone shape having a bottom surface on the plasma generation side (see FIGS. 6A and 6B). Within the recesses 3A, resonance absorption of the microwave occurs on a surface which is not parallel to the surface on the plasma generation side so that plasma is generated.

Shapes of the recesses 3A can be varied depending on a combination of a cross section and a depth direction and is not limited to the illustrated examples.

Experimental Example 1

Figure 7A:
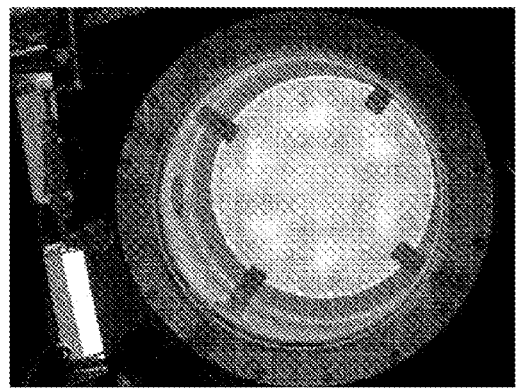
FIG. 7A shows an example (photo) of plasma in case of a flat top plate.
Figure 7B:
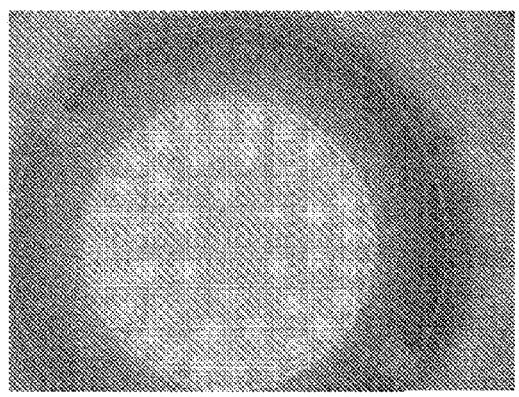
FIG. 7B shows an example (photo) of plasma in case of a top plate of the present embodiment.

FIGS. 7A and 7B show examples for checking an effect of recesses 3A of a top plate 3 by a plasma experiment using the top plate 3 in accordance with the embodiment of the present invention. FIG. 7A shows an example (photo) of plasma in case of a flat top plate (hereinafter, referred to as "conventional top plate"), and FIG. 7B shows an example (photo) of plasma in case of a top plate having the recesses 3A of the present invention (hereinafter, referred to as "top plate of the present invention").

A top plate 3 used in the experiment is made of quartz and the top plate of the present invention further includes a multiple number of recesses 3A as compared to the conventional top plate. A condition of plasma generation was common and the experiment was conducted by using an argon gas at a microwave power of about 2000 W and a pressure of about 1.33 Pa.

In case of the conventional flat top plate, plasma was generated non-uniformly and in particular, it is noticeable that coarse/dense plasma was generated in a peripheral portion thereof. In case of the top plate of the present invention, however, there was little difference between a central portion and a peripheral portion of the top plate 3 and it was found that plasma was generated uniformly within the multiple number of recesses 3A, and, thus, a plasma mode became stable.

Experimental Example 2

Figure 8A:
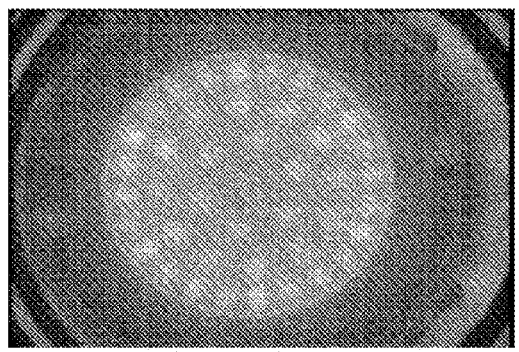
FIG. 8A shows an example (photo) of plasma generated by using the top plate of the present embodiment under a condition of a pressure of about 1.33 Pa.
Figure 8B:
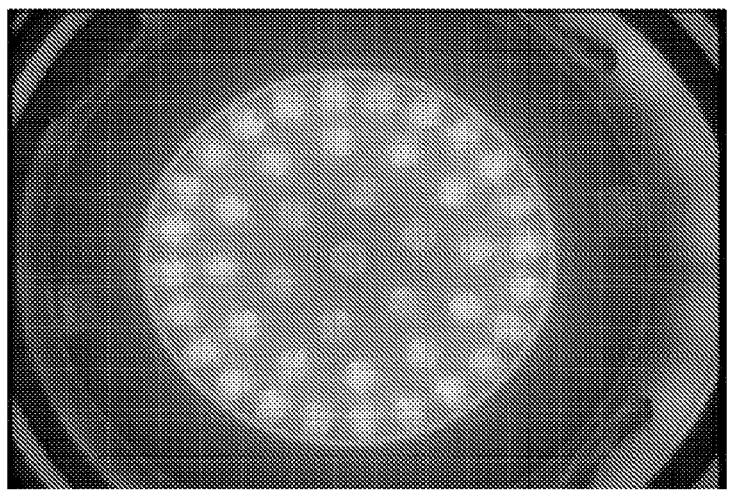
FIG. 8B shows an example (photo) of plasma generated by using the top plate of the present embodiment under a condition of a pressure of about 66.65 Pa.

FIGS. 8A and 8B show examples (photos) of generating plasma at different pressures by using the top plate 3 in accordance with the embodiment of the present invention. FIG. 8A shows a case (condition A) where a pressure is about 1.33 Pa, and FIG. 8B shows a case (condition B) where a pressure is about 66.65 Pa. Other conditions than the pressure are the same as those of Experimental example 1. The experiment was conducted at a pressure of about 1.33 Pa as a condition A and at a pressure of about 66.65 Pa as a condition B. There has been made a comparison on whether or not plasma is generated and on a plasma distribution if the plasma is generated.

As shown in FIG. 8B, even when the experiment was conducted at a relatively high pressure of the condition B, plasma could be generated in the same pattern. Further, as a result of a comparison between FIG. 8A and FIG. 8B, it can be seen from both drawings that plasma was generated within the multiple number of recesses. As a result of a comparison of plasma under the condition A and under the condition B, it can be seen that sizes of plasma are substantially the same and the generated plasma is uniformly distributed.

In the conventional top plate, if a pressure is changed, a generation pattern (a density distribution) of plasma is also changed, and, thus, a pressure needs to be controlled so as to maintain a uniform generation pattern. By using the top plate of the present invention, however, uniform plasma with high reproducibility can be obtained regardless of pressure conditions as shown in Experimental example 2.

Plasma may be generated while controlling a temperature or a kind of a gas besides the pressure conditions. In case of the conventional top plate, setting other conditions are limited due to a low pressure range from about 10 mPa to about several 10 Pa. In case of the top plate of the present invention, however, plasma can be generated at a pressure lower or higher than the conventional pressure, and, thus, optimum conditions can be selected without being limited by pressure conditions.

Hereinafter, there will be explained a plasma processing apparatus in accordance with a second aspect of the present invention. The plasma processing apparatus has the same configuration as illustrated in FIG. 1. As the top plate, the top plate 3 of the plasma processing apparatus in accordance with the first aspect of the present invention is used.

In case of using the conventional top plate, propagation of a microwave in a diametric direction was controlled but propagation in a circumferential direction was not controlled. Thus, a plasma mode was not sufficiently stable. Further, due to a change of a pressure within a plasma generation chamber 2, plasma of a different density distribution was generated and a plasma mode was changed easily. That is, the plasma mode was changed depending on conditions such as a pressure or a temperature of an introduced gas, a kind of the gas, or composition thereof.

By using the top plate 3 in accordance with the embodiment of the present invention, a microwave is absorbed within recesses 3A and plasma is generated. Since plasma 8 can be generated at positions of the recesses 3A regardless of a propagation mode of the microwave in the top plate 3, plasma having substantially the same distribution can be stably obtained. A generation position of the plasma 8 is limited to the positions of the recesses 3A, and, thus, the plasma may have good reproducibility. Since the density distribution of the plasma is fixed to the positions of the recesses and not changed, plasma of the same mode can be generated even if conditions such as a kind and composition of an introduced gas, and a pressure and a temperature are changed.

Even if plasma processes of different conditions are consecutively performed in a plasma processing apparatus 1, a stable plasma mode can be obtained. The plasma 8 having substantially the same distribution can be obtained just by controlling a kind or composition of a gas and a temperature or a pressure for each plasma process. It is not necessary to replace the top plate with another one or change a wavelength of a microwave propagated within the top plate. Further, after a setting change in a temperature or a pressure, it is not necessary to perform a fine control to obtain a required mode or to obtain a stable mode. As compared to a conventional way, a process can be stably performed with high reproducibility in a short time.

Desirably, diameters of the recesses 3A in a propagation direction may be in the range from about ⅓ to about ½ of a wavelength of a microwave propagated within a dielectric member, and its depths may be in the range from about ¼ to about ⅜ of the wavelength of the microwave propagated within the dielectric member. Further, desirably, the recesses 3A may be formed on a circle of which a center is positioned at the inlet position of the microwave, particularly, on a circle of which a radius may be an approximately integer multiple of the wavelength of the microwave propagated within the dielectric member. The supplied microwave can be absorbed efficiently, and, thus, plasma can be generated without any waste. In this case, if the recesses 3A are arranged to have a point symmetry with respect to the inlet position of the microwave, the top plate 3 can be installed in the plasma processing apparatus 1 regardless of the circumferential direction.

Hereinafter, there will be explained a plasma processing method in accordance with a third aspect of the present invention.

When plasma 8 needs to be generated within a plasma processing apparatus 1, a top plate 3 having recesses 3A in its surface on a plasma generation side is used. Resonance absorption of a microwave occurs at side surfaces 3As of the recesses 3A, so that strong plasma can be generated therein in a single mode. Since the plasma is generated at positions of the recesses 3A of the top plate 3, a plasma mode can be stable.

Diameters of the recesses 3A in a propagation direction may be in the range from about ⅓ to about ½ of a wavelength of the microwave propagated within a dielectric member, and its depth may be in the range from about ¼ to about ⅜ of the wavelength of the microwave propagated within the dielectric member, so that the microwave is propagated within the recesses 3A in a single mode and strong plasma can be generated. Further, a radius of a circle of which a center is positioned at an inlet position of the microwave may be an approximately integer multiple of the wavelength of the microwave propagated within the dielectric member, so that resonance absorption of the microwave occurs at the side surfaces 3As of the recesses 3A where standing waves become strong and, thus, strong plasma can be obtained.

The recesses 3A are arranged to have a point symmetry with respect to an inlet position of the microwave, so that a plasma mode in a circumferential direction is stable and a top plate can be installed regardless of the direction.

Further, the plasma 8 is generated within the recesses in a single mode. Therefore, even if an atmosphere in a plasma generation chamber 2 of the plasma processing apparatus 1 is changed or a substrate processing method and a plasma processing condition are changed, i.e., conditions such as a kind and composition of an introduced gas and a pressure and a temperature of the gas are changed, a plasma process can be performed without changing the top plate 3 and the wavelength of the microwave propagated within the top plate 3.

In accordance with the present invention, plasma of the same mode can be generated stably, and, thus, plasma processes can be consecutively performed under different conditions without changing a top plate and a wavelength of a microwave propagated within the top plate. The present invention is particularly useful for a case where conditions of a film forming process or an etching process need to be changed. In addition, a plasma processing method of the present invention can be applied to all kinds of plasma processes such as an asking process.

Further, a substrate as a target object is not limited to a semiconductor substrate but can be a glass substrate or a ceramic substrate and the present invention can be applied to a plasma process using various kinds of substrates.

Furthermore, the top plate, the plasma processing apparatus, and the plasma processing method explained in the above embodiments are just examples and the present invention is not limited thereto.

The present application is based on Japanese Patent Application No. 2008-31310 filed on Feb. 13, 2008. A specification, claims and drawings of Japanese Patent Application No. 2008-31310 is incorporated herein by reference in its entirety.

INDUSTRIAL APPLICABILITY

The present invention is useful for a top plate of a microwave plasma processing apparatus, a plasma processing apparatus, and a plasma processing method.

What is claimed is:

1. A top plate made of a dielectric material for propagating a microwave in a microwave plasma processing apparatus, the top plate comprising:
  a plurality of spaced apart recesses formed in a surface of the top plate on a plasma generation side,
  a central recess formed on a surface opposite the plasma generation side,
  wherein resonance absorption of the microwave occurs at a side surface of the plurality of spaced apart recesses,
  the microwave is propagated within the plurality of spaced apart recesses in a single mode,
  the plurality of spaced apart recesses are arranged in one or more circles, such that the plurality of spaced apart recesses are arranged circumferentially along each circle, a center of the one or more circles is positioned at an inlet position of the microwave,
  the plurality of spaced apart recesses are not formed at a center of the top plate,
  a diameter of each of the plurality of spaced apart recesses in a propagation direction of the microwave is in a range from about ⅓ to about ½ of a wavelength of the microwave propagated within the dielectric material, and
  a radius of the circle on which the plurality of spaced apart recesses is arranged is an approximately integer multiple of the wavelength of the microwave propagated within the dielectric material.

2. The top plate of the microwave plasma processing apparatus of claim 1, wherein the top plate has a thickness that allows the microwave to be propagated in a multi-mode.

3. The top plate of the microwave plasma processing apparatus of claim 1, wherein plurality of spaced apart recesses are arranged to have a point symmetry with respect to an inlet position of the microwave.

4. The top plate of the microwave plasma processing apparatus of claim 1, wherein a depth of the at least one recess is in a range from about ¼ to about ⅜ of a wavelength of the microwave propagated within the dielectric material.

5. The top plate of the microwave plasma processing apparatus of claim 1, wherein a cross section of the at least one recess parallel to the surface on the plasma generation side has a circular shape.

6. A plasma processing apparatus comprising:
  a plasma generation chamber that performs a plasma process;
  a slot antenna that introduces a microwave for plasma generation into the plasma generation chamber; and a top plate including a plurality of recesses formed in a surface on a plasma generation side, and a central recess formed on a surface opposite the plasma generation side, wherein resonance absorption of the microwave occurs at a side surface of the plurality of spaced apart recesses, the microwave is propagated within the recess in a single mode, the plurality of spaced apart recesses are arranged in one or more circles such that the plural spaced apart recesses are arranged circumferentially along each circle, a center of the one or more circles is positioned at an inlet position of the microwave, the plurality of spaced apart recesses are not formed at a center of the top plate, a diameter of each of the plurality of spaced apart recesses in a propagation direction of the microwave is in a range from about ⅓ to about ½ of a wavelength of the microwave propagated within a dielectric material, and a radius of the circle on which the plurality of spaced apart recesses is arranged is an approximately integer multiple of the wavelength of the microwave propagated within the dielectric material.

7. A plasma processing method comprising:

generating plasma by using a top plate including a plurality of spaced apart recesses formed in a surface of the top plate on a plasma generation side and a central recess formed on a surface opposite the plasma generation side, wherein resonance absorption of a microwave occurs at a side surface of the plurality of spaced apart recesses, the microwave is propagated within the recess in a single mode, the plurality of spaced apart recesses are arranged in one or more circles such that the plural spaced apart recesses are arranged circumferentially along each circle, a center of the one or more circles is positioned at an inlet position of the microwave, the plurality of spaced apart recesses are not formed at a center of the top plate, and a diameter of each of the plurality of spaced apart recesses in a propagation direction of the microwave is in a range from about ⅓ to about ½ of a wavelength of the microwave propagated within a dielectric material, and a radius of the circle on which the at least one plurality of spaced apart recesses is arranged is an approximately integer multiple of the wavelength of the microwave propagated within the dielectric material.

8. The plasma processing method of claim 7, wherein generating plasma includes:

generating plasma under two or more different atmosphere conditions in a plasma generation chamber without changing the top plate and a wavelength of the microwave propagated within the top plate.

* * * * *

UNITED STATES PATENT AND TRADEMARK OFFICE
CERTIFICATE OF CORRECTION

| | | |
|---|---|---|
| PATENT NO. | : 8,967,080 B2 | Page 1 of 1 |
| APPLICATION NO. | : 12/867343 | |
| DATED | : March 3, 2015 | |
| INVENTOR(S) | : Caizhong Tian et al. | |

It is certified that error appears in the above-identified patent and that said Letters Patent is hereby corrected as shown below:

In the Specification

Column 4, line 34, please add -- 3 -- between "plate" and "has a"

Signed and Sealed this
Eighteenth Day of August, 2015

Michelle K. Lee
*Director of the United States Patent and Trademark Office*